United States Patent
Lan

[11] Patent Number: 5,963,819
[45] Date of Patent: Oct. 5, 1999

[54] METHOD OF FABRICATING SHALLOW TRENCH ISOLATION

[75] Inventor: Shih-Ming Lan, Chang Hwa, Taiwan

[73] Assignee: United Silicon Incorporated, Hsinchu, Taiwan

[21] Appl. No.: 09/057,598

[22] Filed: Apr. 8, 1998

[30] Foreign Application Priority Data

Jan. 26, 1998 [TW] Taiwan ................................. 87101057

[51] Int. Cl.$^6$ .................................................. H01L 21/762
[52] U.S. Cl. ............................................................ 438/424
[58] Field of Search ........................... 438/424, FOR 227

[56] References Cited

U.S. PATENT DOCUMENTS

| | | |
|---|---|---|
| 5,316,965 | 5/1994 | Philopossian et al. . |
| 5,506,168 | 4/1996 | Morita et al. . |
| 5,677,233 | 10/1997 | Abiko . |
| 5,712,185 | 1/1998 | Tsai et al. . |
| 5,801,083 | 9/1998 | Yu et al. . |
| 5,834,358 | 11/1998 | Pan et al. . |

Primary Examiner—George Fourson
Attorney, Agent, or Firm—Thomas, Kayden, Horstemeyer & Risley, LLP

[57] ABSTRACT

A method of fabricating a shallow trench isolation. On a substrate comprising a pad oxide layer and a mask layer on the pad oxide layer, a trench which penetrates through the mask layer, the pad oxide layer, and a part of the substrate is formed. A part of the mask layer is removed to form an opening on top of the trench, wherein the opening is wider than the trench. An insulation layer is formed on the mask layer to fill the opening and the trench. The insulation layer is etched until the mask layer is exposed. The mask layer is removed, so that a T-shape insulation plug is formed. The insulation plug and the pad oxide layer are etched until the insulation plug and the substrate are at a same level.

9 Claims, 6 Drawing Sheets ial no. 87101057, filed Jan. 26, 1998, the full
METHOD OF FABRICATING SHALLOW TRENCH ISOLATION

CROSS-REFERENCE TO RELATED APPLICATION

This application claims priority benefit of Taiwan application Serial no. 87101057, filed Jan. 26, 1998, the full disclosure of which is incorporated herein by reference.

BACKGROUND OF THE INVENTION

1. Field of the Invention

The invention relates to a method of fabricating a shallow trench isolation (STI), and more particularly to a method of preventing the formation of field oxide recess on the surface of an STI.

2. Description of the Related Art

In a complete circuit, for example, an integrated circuit (IC), thousands of metal-oxide-semiconductors (MOS) transistors are formed. To prevent short circuit between adjacent MOS transistors, an insulation layer, for example, a field oxide layer (FOX), or an STI for isolation is formed to defined an active region.

STI is a common conventional structure of isolating devices. A nitride layer is formed on the substrate as an etching mask. Using anisotropic etching, a trench is formed. The trench is then filled with oxide until its surface level is about the same as the substrate surface. The STI fabricated by the above conventional method has a field oxide recess.

Referring to FIG. 1A to FIG. 1G, a conventional method of fabricating an STI is shown. In FIG. 1A, a pad oxide layer 12 is formed on a substrate 10. Using chemical vapor deposition (CVD), a silicon nitride layer 14 is formed on the pad oxide layer 12. A photo-resist layer 18 is formed and patterned on the silicon nitride layer 14.

Using the photo-resist layer 18 as a mask, the silicon nitride layer 14, the pad oxide layer 12, and the substrate 10 are etched to form a trench 16 which penetrates through a part of the substrate 10.

In FIG. 1C, the photo-resist layer 18 is removed. The trench 16 is filled with an oxide layer 26, for example, a silicon oxide layer formed by atmosphere pressure CVD (APCVD) with tetra-ethyl-ortho-silicate (TEOS) as a gas source. In the case of a TEOS base oxide layer, a process of densification is performed after deposition at about 1000° C. for 10 min to 30 min.

In FIG. 1D, using chemical-mechanical polishing (CMP), the TEOS base silicon oxide layer 26 is removed with the silicon nitride layer 14a as an etch stop layer. An oxide plug 36 is formed within the trench 16. Since the oxide plug 36 is softer than the silicon nitride layer 14, during CMP, a recess (not shown) is formed in the junction between the oxide plug 36 and the silicon nitride layer 14.

In FIG. 1E, the silicon nitride layer 14 is removed to expose the pad oxide layer 12. While removing the silicon nitride layer 14, normally, the rim of the oxide plug 36 is removed, so that in the subsequent process for etching the oxide plug 36 and the pad oxide layer 12, a recess is easily formed.

In FIG. 1F, using hydrogen fluoride (HF) as an etchant, the pad oxide layer 12 and the oxide plug 36 are wet etched until the oxide plug 36 and the surface of the substrate 10 are at a same level. The edge of the oxide plug 36, that is, the junction between the oxide plug 36 and the substrate 10, is over etched to cause a field oxide recess 46a. The formation of the field oxide recess 46a affect the quality of device, for example, the threshold voltage is reduced, the abnormal critical current and leakage current occur.

In FIG. 1G, a gate oxide layer 22 is formed by thermal oxidation. The MOS transistor is formed by the conventional method.

In the conventional method, the formation of the field oxide recess causes an accumulation of charges. The electric field is increased, the threshold voltage for turning on operation is increased, and more than once, an abnormal subthreshold current is produced. This is the so called "kink effect". In addition, a corner parasitic MOS transistor is formed, so that device leakage current occurs. The reduced threshold voltage, the abnormal subthreshold current, and the leakage degrade the quality of device and reduce the yield of production.

SUMMARY OF THE INVENTION

It is therefore an object of the invention to provide a method of fabricating an STI to prevent the formation of a field oxide recess. Consequently, the disadvantages caused by the field oxide recess are suppressed.

To achieve these objects and advantages, and in accordance with the purpose of the invention, as embodied and broadly described herein, the invention is directed towards a method of fabricating an STI. On a substrate comprising a pad oxide layer and a mask layer on the pad oxide layer, a trench which penetrates through the mask layer, the pad oxide layer, and a part of the substrate is formed. A part of the mask layer is removed to form an opening on top of the trench, wherein the opening is wider than the trench. An insulation layer is formed on the mask layer to fill the opening and the trench. The insulation layer is etched until the mask layer is exposed. The mask layer is removed, so that a T-shape insulation plug is formed. The insulation plug and the pad oxide layer are etched until the insulation plug and the substrate are at a same level.

It is to be understood that both the foregoing general description and the following detailed description are exemplary and explanatory only and are not restrictive of the invention, as claimed.

DESCRIPTION OF THE PREFERRED EMBODIMENTS

Figure 1A:
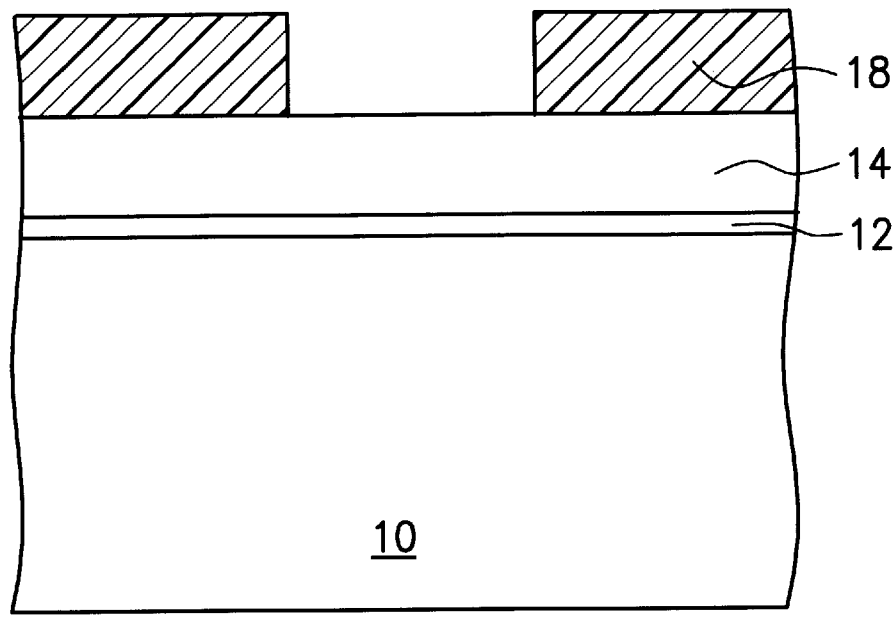
FIG. 1A to FIG. 1G show a conventional method of fabricating an STI.
Figure 1B:
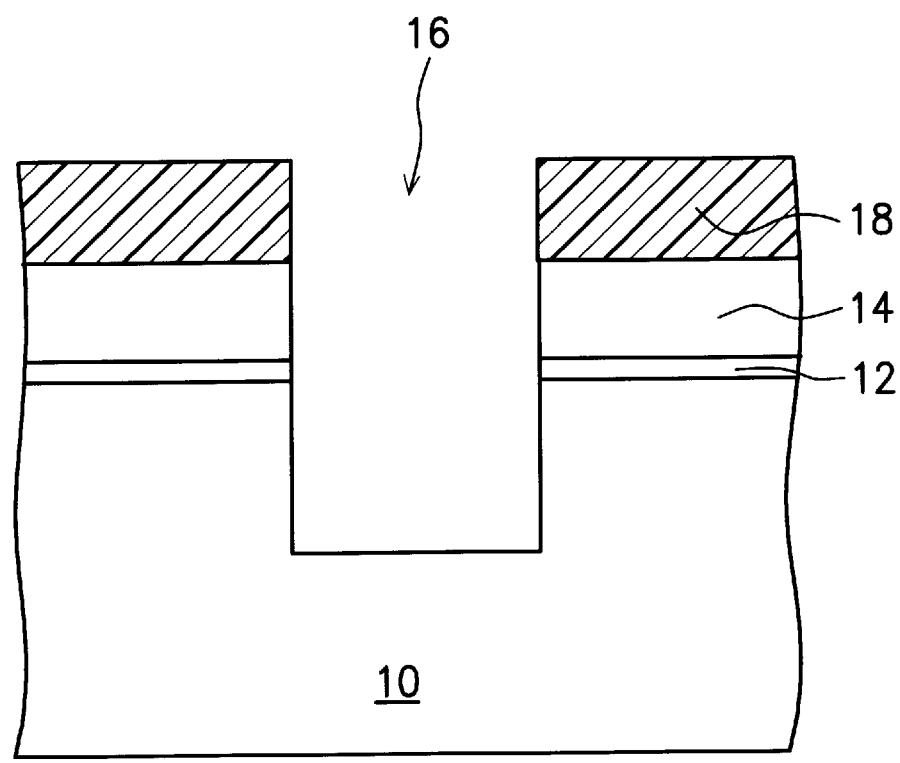
Figure 1C:
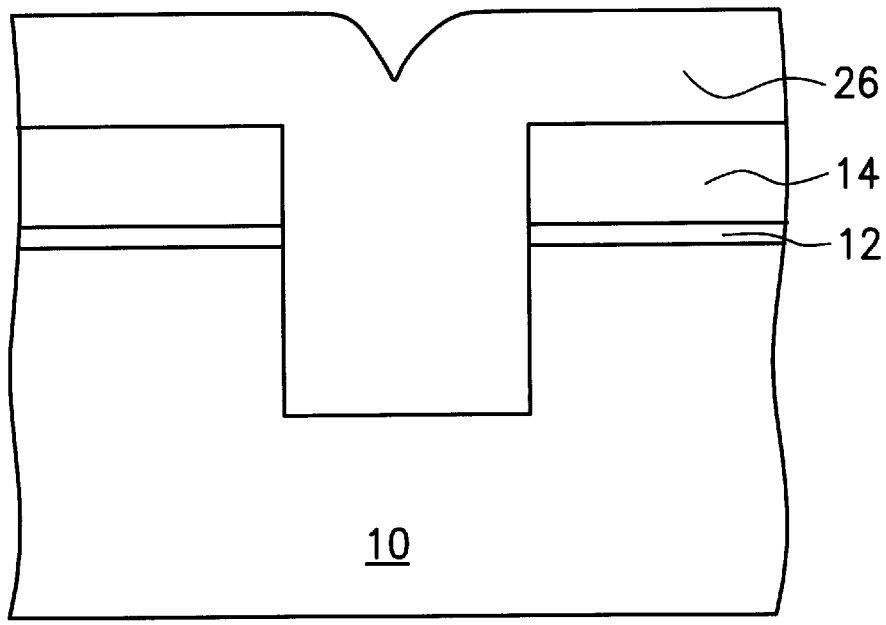
Figure 1D:
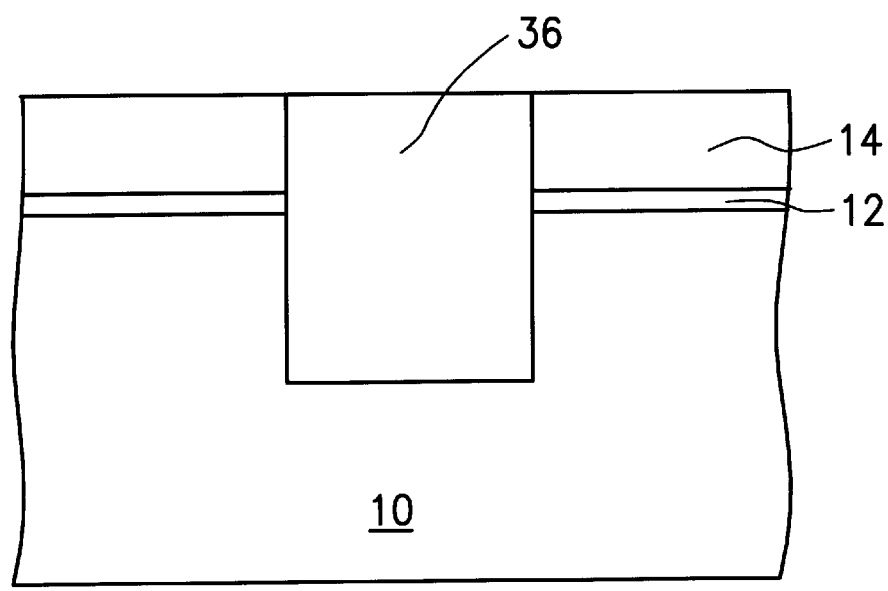
Figure 1E:
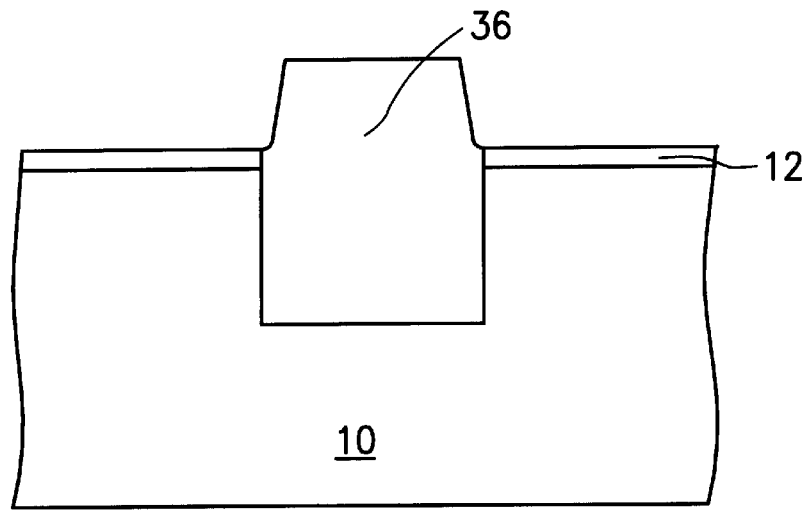
Figure 1F:
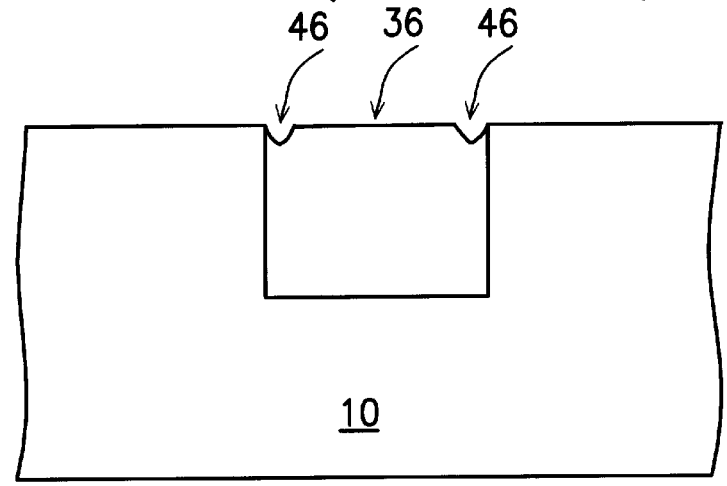
Figure 1G:
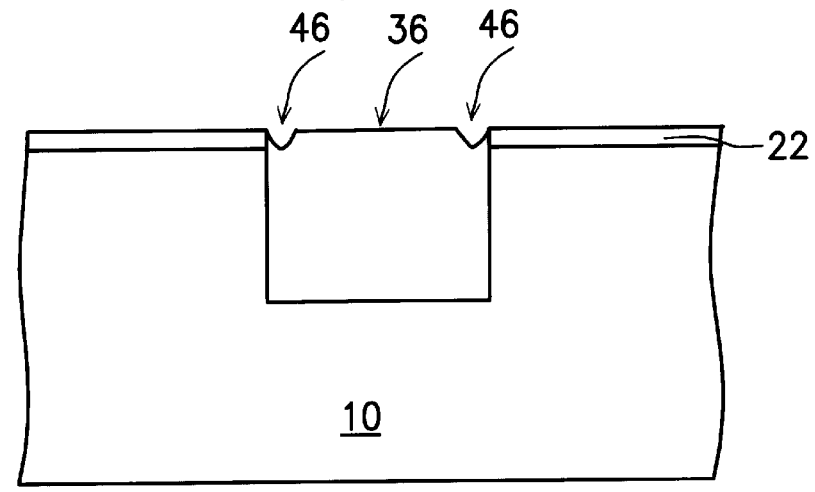
Figure 2A:
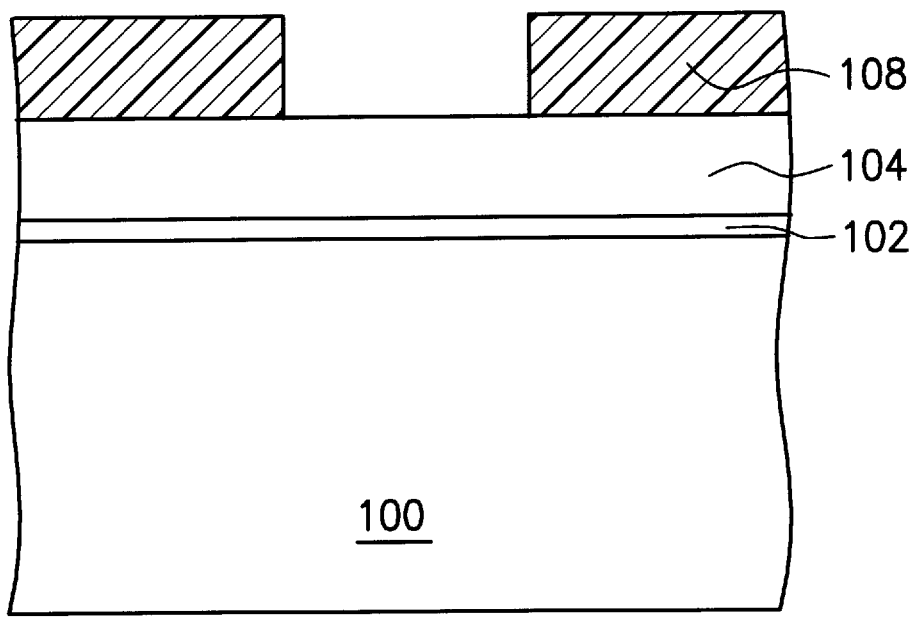
FIG. 2A to FIG. 2H show a method of fabricating an STI in a preferred embodiment according to the invention.

In FIG. 2A, a pad oxide layer 102 is formed, for example, by thermal oxidation, on a semiconductor substrate 100. A silicon nitride layer 104 is formed, for example, by CVD, on the pad oxide layer 102. A photo-resist layer 108 is formed and etched on the silicon nitride layer 104.

Figure 2B:
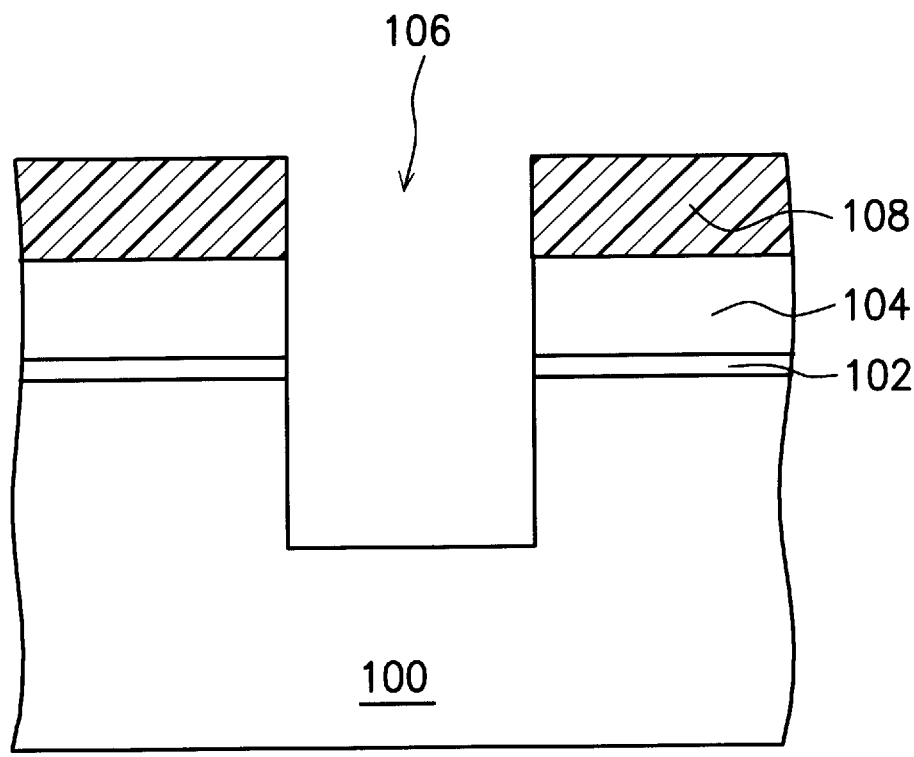

In FIG. 2B, using the photo-resist layer 108 as a mask, the silicon nitride layer 104, the pad oxide layer 102, and the substrate 100 are etched to form a trench 106 which penetrate a part of the substrate 100.

Figure 2C:
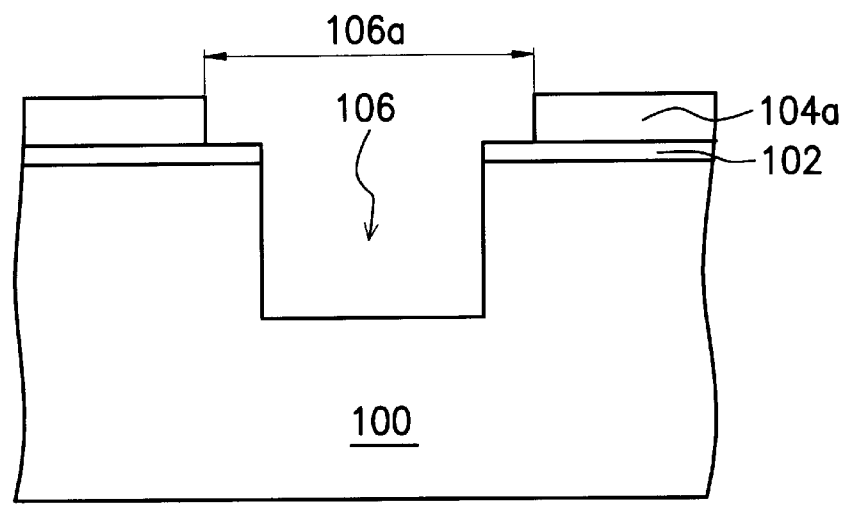

In FIG. 2C, the photo-resist layer 108 is removed. A part of the silicon nitride layer 104 is further removed to expose a part of the pad oxide layer 102, so that an opening 106a has a width wider than the trench 106 is formed thereupon. The part of the silicon 104 is removed by wet etching at about 25° C. to 250° C. by using phosphoric acid ($H_3PO_4$)

as an etchant. The proportion for phosphoric acid to water $H_3PO_4/H_2O$ is about 5/1 to 50/1. The removed thickness of the silicon nitride layer 14 is about 50 Å to 2000 Å. The resultant silicon nitride layer 14a is shown as figure.

Figure 2D:
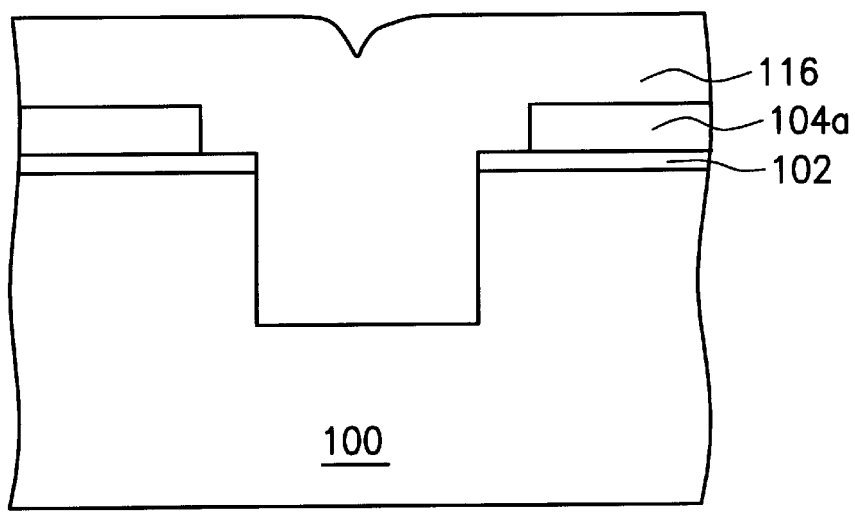
Figure 2E:
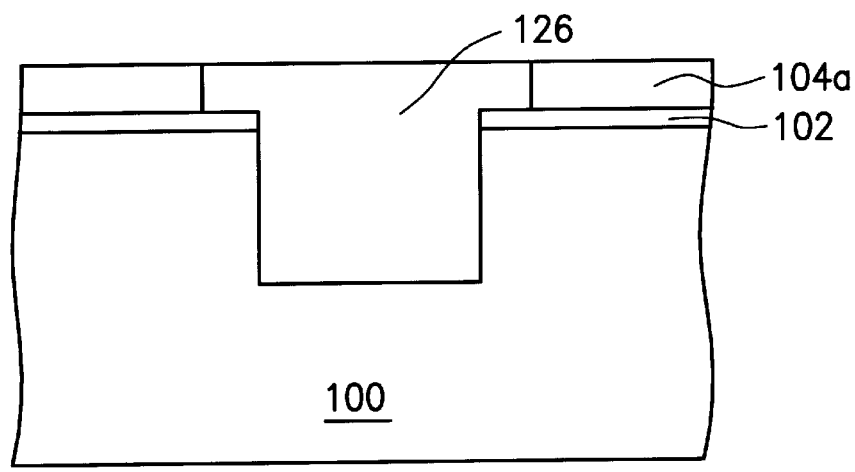

In FIG. 2D, an oxide layer 116 is formed to fill the trench 106 and the opening 106a, and cover the silicon nitride layer 14a. The oxide layer 116 is formed, for example, by CVD with TEOS as a gas source. In the case of a oxide layer, a process of densitication is performed after deposition at about 1000° C. for about 10 min to 30 min. Using the silicon nitride layer 14a as an etch stop, the oxide layer 116 is etched to form an oxide plug 126.

Figure 2F:
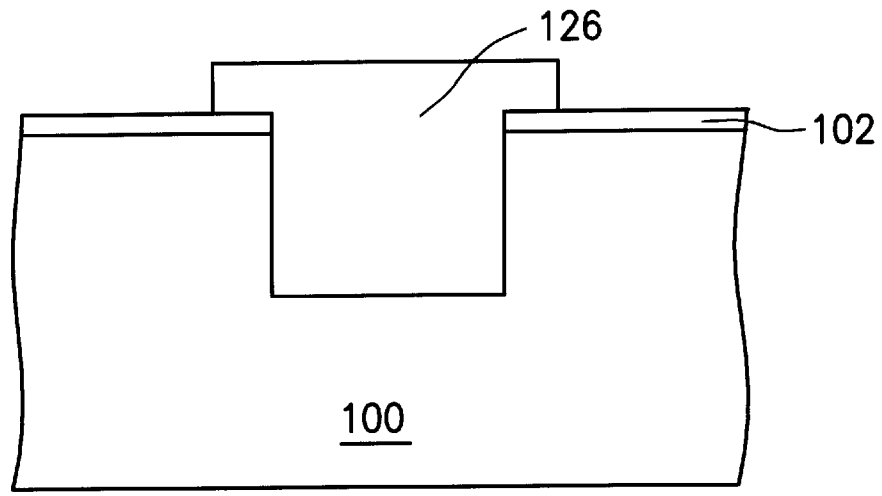

In FIG. 2F, the silicon nitride layer 104a is removed to expose the pad oxide layer 102. The resultant oxide plug 126 covers a part of the pad oxide layer 102 and has a T-shape as shown in the figure. Thus, while removing the silicon nitride layer 104a, even the rim of the oxide plug 126 is etched away, a recess is not so easy to be formed.

Figure 2G:
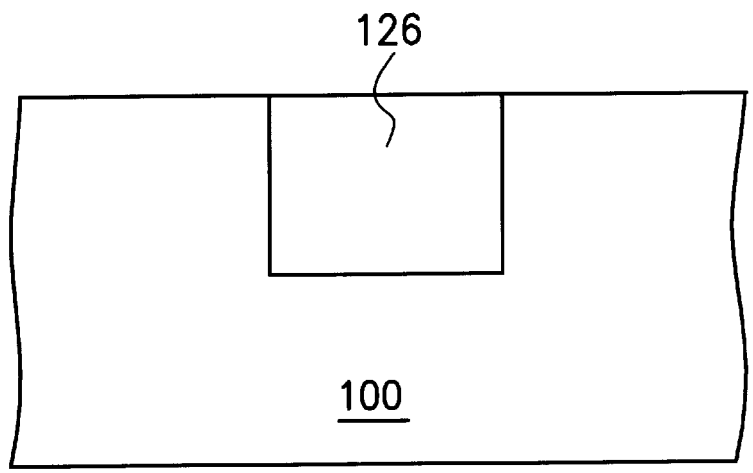

In FIG. 2G, the pad oxide 102 and the oxide plug 126 are wet etched with the hydrogen fluoride (HF) as an etchant. Since the oxide plug 126 covers a part of the pad oxide layer 102, in the junction between the trench and the substrate 100, a recess is not formed.

Figure 2H:
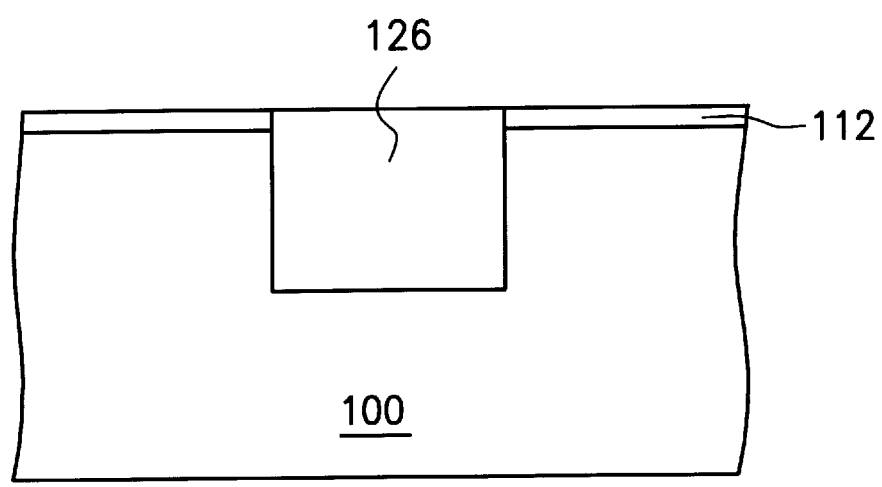

In FIG. 2H, a gate oxide layer 112 is formed on the trench and the substrate 100.

In the invention, the formation of a recess in the junction between the trench and the substrate is prevented. The disadvantage of an accumulation of charges is suppressed. Consequently, the increasing electric field, the increasing threshold voltage, and the abnormal subthreshold current are prevented. Therefore, the device quality is enhanced, and the yield of production is improved.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a shallow trench isolation, wherein a substrate comprising a pad oxide layer and a mask layer on the pad oxide layer is provided, comprising:

forming a trench which penetrates through the mask layer, the pad oxide layer, and a part of the substrate;

removing a part of the mask layer to form an opening on top of the trench, wherein the opening is wider than the trench;

forming an insulation layer on the mask layer to fill the opening and the trench;

etching the insulation layer until the mask layer is exposed;

removing the mask layer, so that a T-shape insulation plug is formed; and etching the insulation plug and the pad oxide layer until the insulation plug and the substrate are at a same level.

2. The method according to claim 1, wherein the mask layer includes a silicon nitride layer.

3. The method according to claim 1, wherein the opening is formed by isotropically etching the mask layer.

4. The method according to claim 3, wherein the mask layer is etched at about 25° C. to 250° C. with phosphoric acid as an etchant, and the volume proportion for phosphoric acid to water is about 5/1 to 50/1.

5. The method according to claim 1, wherein the insulation layer includes an oxide layer.

6. The method according to claim 1, wherein the insulation plug includes an oxide plug.

7. A method of fabricating a shallow trench isolation, wherein a substrate comprising a pad oxide layer and a silicon nitride layer on the pad oxide layer is provided, comprising:

forming a trench which penetrates through the silicon nitride layer, the pad oxide layer, and a part of the substrate;

removing a part of the silicon nitride layer to form an opening on top of the trench, wherein the opening is wider than the trench;

forming an oxide layer on the silicon nitride layer to fill the opening and the trench;

etching the oxide layer until the silicon nitride layer is exposed;

removing the silicon nitride layer, so that a T-shape oxide plug is formed; and etching the oxide plug and the pad oxide layer until the oxide plug and the substrate are at a same level.

8. The method according to claim 1, wherein the opening is formed by isotropically etching the silicon nitride layer.

9. The method according to claim 8, wherein the silicon nitride layer is etched at about 25° C. to 250° C. with phosphoric acid as an etchant, and the volume proportion for phosphoric acid to water is about 5/1 to 50/1.

* * * * *